United States Patent [19]

Hayashide

[11] Patent Number: 5,500,558
[45] Date of Patent: Mar. 19, 1996

[54] SEMICONDUCTOR DEVICE HAVING A PLANARIZED SURFACE

[75] Inventor: Yoshio Hayashide, Hyogo, Japan

[73] Assignee: Mitsubishi Denki Kabushiki Kaisha, Tokyo, Japan

[21] Appl. No.: 298,296

[22] Filed: Aug. 31, 1994

[30] Foreign Application Priority Data

Feb. 23, 1994 [JP] Japan ................................. 6-025220

[51] Int. Cl.$^6$ ..................... H01L 21/321; H01L 23/522
[52] U.S. Cl. ................................. 257/758; 257/760
[58] Field of Search ............................ 257/760, 758, 257/211, 903, 752, 639–641, 644

[56] References Cited

U.S. PATENT DOCUMENTS

| 3,801,880 | 4/1974 | Haraoa et al. | 257/752 |
| 4,954,459 | 9/1990 | Avanxino | 437/228 |
| 5,077,238 | 12/1991 | Fujii et al. | 437/228 |
| 5,317,192 | 5/1994 | Chen et al. | 257/760 |

FOREIGN PATENT DOCUMENTS

| 0111651 | 6/1984 | European Pat. Off. . |
| 136934 | 12/1984 | Japan . |
| 0303742 | 12/1989 | Japan | 257/752 |
| 0030052 | 5/1993 | Japan . |

OTHER PUBLICATIONS

Patent Abstracts of Japan, Kokai #06–021245 (Jan. 28, 1994) vol. 18, No . 225 (E–1541) Apr. 22, 1994.
Patent Abstracts of Japan, Kokai #02–219264 (Aug. 31, 1990) vol. 14, No. 520 (E–1002) Nov. 14, 1990.
S. Wolf, "Silicon Processing for the VLSI Era–Volume II," Lattice Press CA., U.S.A., pp. 238–239, undated.

*Primary Examiner*—Peter Toby Brown
*Attorney, Agent, or Firm*—Lowe, Price, Leblanc & Becker

[57] ABSTRACT

An object of the present invention is to completely reduce a difference in level in a short time at a convex pattern spreading horizontally on a large scale and obtain a semiconductor device having a planarized surface. An insulating film is formed on a semiconductor substrate to cover a horizontally spreading convex pattern and to fill in a concave portion. A portion of insulating film located on a planarized portion of convex pattern is selectively etched away so as to leave a frame-shaped insulating film having a width of 1–500 μm at least on the outer periphery portion of convex pattern. Insulating film left on semiconductor substrate is etched by chemical/mechanical polishing method, thereby planarizing a surface of the semiconductor substrate.

1 Claim, 21 Drawing Sheets

SEMICONDUCTOR DEVICE HAVING A PLANARIZED SURFACE

BACKGROUND OF THE INVENTION

1. Field of the Invention

The present invention relates generally to a semiconductor device, and more particularly, to a semiconductor device having a planarized surface. The invention further relates to a method of manufacturing such a semiconductor device.

2. Description of the Background Art

FIG. 22 is a sectional view showing a conventional semiconductor device. At a surface of a silicon substrate 1, an isolation oxide film 2 for isolating an active region from another is formed. In the active region, a field effect transistor (MOSFET) is formed consisting of a gate oxide film 3, a gate 4 of, for example, tungsten silicide, and impurity diffusion layers 6. A first interlayer insulating film 17 is formed by a silicon oxide film 8, a silicon nitride film 9, a BPSG (Boro-Phospho Silicate Glass) film 10 and a silicon oxide film 12. A surface of BPSG film 10 is planarized by heat treatment in oxygen or steam atmosphere. Silicon nitride film 9 is provided so as to prevent oxidation of the underlying silicon substrate 1 and gate 4 during thermal treatment. Silicon oxide film 12 is provided because of the following reason. That is, BPSG film 10 absorbs moisture during manufacturing process, thereby forming phosphoric acid at the surface of BPSG film 10. Silicon oxide film 12 prevents corrosion of a first interconnection layer 15 by the phosphoric acid.

A contact hole is provided in first interlayer insulating film 17. A first plug 14 is formed by filling the contact hole with tungsten or the like. First plug 14 connects impurity diffusion layer 6 or gate 4 and first interconnection layer 15 which will be described later.

First interconnection layer 15 is formed on first interlayer insulating film 17. A second interlayer insulating film 27 is provided to cover first interconnection layer 15. Second interlayer insulating film 27 consists of a silicon oxide film 18 formed by such method as plasma-excited chemical vapor deposition (plasma CVD) or Spin-On-Glass (SOG). A through-hole is formed in second interlayer insulating film 27. A second plug 24 is filled in the through-hole. Second plug 24 connects first interconnection layer 15 and a second interconnection layer 25.

By using a similar method, second interconnection layer 25, a third interlayer insulating film 37, a third plug 34, a third interconnection layer 35, a fourth interlayer insulating film 47, a fourth plug 44, and a fourth interconnection layer 45 are formed. A protection film 46 consisting of a silicon nitride film or the like which is formed by plasma CVD is formed as an uppermost layer.

The above-described semiconductor device includes MOSFET and four layers of interconnections. If an interlayer insulating film is formed by a conventional method (such as SOG), a stepped portion can locally be planarized. However, in a region where a difference in level exceeds 10 μm, the difference cannot be reduced. Therefore, a stepped portion is generated between a region having many layers of interconnections and a region having no interconnection. Upper layers have greater difference in level.

The greater difference in level gives rise to the following problem. A small pattern must be formed by photolithography in order to enhance integration level of a semiconductor device. A small pattern can be formed by, for example, using an optical system which has a high numerical aperture (NA), or by performing exposure with light having a short wavelength. In any of the methods, however, there is a drawback that the depth of focus will be shorter. Therefore, it is impossible to make a small pattern at a plane where a great difference in level exists. Consequently, pitch between wires must be made larger at upper interconnection layers, making it eventually difficult to enhance integration level.

In order to solve the above-described problem, a method for planarizing a surface of a semiconductor device is proposed (in Japanese Patent Laying-Open No. 5-30052) in which a convex portion of an interlayer insulating film is selectively removed by Chemical/Mechanical Polishing (CMP).

FIG. 23 shows the concept of CMP method. A polishing cloth 62 is provided on a polishing board 61. Polishing cloth 62 is made of polyurethane. Polishing agent 64 is supplied to polishing cloth 62 from a tube 65. Polishing agent 64 is prepared by suspending particles of silica ($SiO_2$) with a diameter of approximately 0.01 μm in alkalescent liquid. A semiconductor wafer 63 is pressed by a supporting rod 168 toward polishing board 61 so that its surface contacts polishing cloth 62. By rotating polishing board 61 and supporting rod 168 while supplying polishing agent 64 to polishing cloth 62, the surface of semiconductor wafer 63 is polished chemically and mechanically.

FIG. 24 is a cross sectional view of a semiconductor device having an interlayer insulating film planarized by CMP method. By this method as well, a stepped portion is generated between a region 16 which is wide and having a high density of interconnections and a region 26 having a low density of interconnections.

The reason for the generation of such a stepped portion will be described below with reference to FIG. 24. In region 16 having a high interconnection density, when interlayer insulating film 27 is formed on interconnections, a gap between interconnections 15 is filled with interlayer insulating film 27, thereby forming a convex pattern 83 spreading horizontally on a large scale. On the other hand, in region 26 having a low interconnection density, a gap between interconnections 15 is not completely filled. Therefore, even after the formation of interlayer insulating film 27, a concave portion 84 reflecting the shape of the pattern corresponding to the interconnection layers 15 is formed at a surface of interlayer insulating film 27.

A study has been conducted as to the dependency of the degree of planarization in CMP method. The result is as follows.

FIG. 25 is a plan view of a semiconductor wafer. Approximately one hundred chips 67 are formed on the semiconductor wafer 63. FIG. 26 is an enlarged view of chip 67. A convex portion 90 is formed on chip 67. The two-dimensional shape of convex portion 90 is substantially a quadrangle having longer and shorter sides 69 and 70. As a result of the study, it has been found that the degree of planarization obtained in CMP method depends on a length of shorter side 70 of convex portion 90; a convex portion 90 of which shorter side 70 is rather long is generally hard to planarize. This will be explained later in detail.

Referring to FIG. 27A, the ratio ($H/H_0$) between the height ($H_0$) of an initial convex portion 90 and the height (H) of a polished convex portion 71 is defined herein as a relative difference in level. FIG. 27B is a plan view of FIG. 27A. Referring to FIG. 27B, the two-dimensional shape of the unpolished convex portion 90 is substantially a quadrangle including longer and shorter sides 69 and 70.

FIG. 28 shows the relation between the relative difference in level ($H/H_0$) and polishing amount on the planarized portion regarding convex portion 90 of various sizes.

Referring to FIG. 27B and FIG. 28, straight lines 71 through 75 show the data obtained when the length of shorter side 70 of convex portion 90 is 20 μm, 150 μm, 300 μm, 500 μm, and 1.2 mm, respectively.

Referring to FIG. 28, the relative difference in level decreases exponentially as a function of the polishing amount on the planarized portion. Regarding the convex portion of which shorter side is rather long, however, the straight line is less inclined (see straight line 75). It has been empirically recognized that the relation between the polishing amount R on the planarized portion and the relative difference in level ($H/H_0$) can be expressed by the following empirical formula.

$$H/H_0 = exp(-R/R_0)$$

wherein $R_0$ is a constant. It has been found that there is correlation as shown in FIG. 29A between the length of shorter side 70 of convex portion 90 and the polishing amount R required for making 1/e the relative difference in level ($H/H_0$). FIG. 29B shows the relation between the length of longer side 69 of convex portion 90 and the polishing amount R required for making 1/e the relative difference in level ($H/H_0$). It has been learned that there is no correlation between the two. FIG. 29C shows the relation between plane area (longer side 69 x shorter side 70) of convex portion 90 and the polishing amount R required for making 1/e the relative difference in level. There has been no correlation found between the two.

In an actual semiconductor device, a portion corresponding to a memory device or the like is formed by a pattern having a high density of interconnections, and this portion providing a convex pattern 83 spreading horizontally on a large scale (see FIG. 24). The length of shorter side 70 of such convex pattern 83 sometimes exceeds 1 mm, and it is likely to be longer in the future. If such convex pattern 83 spreading horizontally on a large scale is planarized only by CMP, the polishing amount of 1 μm or more is required on the planarized portion, as shown in FIG. 29A. However, uniformity of thickness of a film formed on the wafer considerably degrades as polishing amount increases. In order to maintain the uniformity of the thickness of the film, the maximum polishing amount on the planarized portion is approximately 0.5 μm.

Avanzino et al. proposes a method to avoid the above-mentioned problem (in U.S. Pat. No. 4,954,459).

FIGS. 30–33 are partial cross sectional views showing in order respective steps in a method disclosed in U.S. Pat. No. 4,954,459 for completely planarizing a convex pattern by CMP.

Referring to FIG. 30, a raised portion 81 is formed on a substrate 1. An insulating film 82 is formed on substrate 1, covering raised portion 81. A surface of insulating film 82 protrudes on raised portion 81 and sinks between raised portions 81. A resist pattern 86, having an opening portion 85 on the protruded portion of insulating film 82 (hereinafter referred to as a convex portion 91), is formed on insulating film 82.

Referring to FIGS. 30 and 31, convex portion 91 of insulating film 82 is etched using resist pattern 86 as a mask.

Referring to FIGS. 31 and 32, resist pattern 86 is removed. Referring to FIG. 33, the surface of insulating film 82 is planarized by CMP.

A first problem of the above-mentioned method disclosed in U.S. Pat. No. 4,954,459 is that resist pattern 86 cannot be formed satisfactorily. If a resist pattern is to be formed on insulating film 82 covering raised portion 81 as illustrated in FIG. 34A, the resist pattern 86 to be formed then has a shape shown in FIG. 34B.

Consequently, the first problem is that resist pattern 86 falls down or disappears during developing or etching process if a width W of resist pattern 86 is, for example, 0.4 μm or less.

FIGS. 35A–35C illustrates a second problem. Like or corresponding elements in FIGS. 35A–35C are denoted by like reference numerals in FIG. 34, and a description thereof will therefore not be repeated. The second problem is that opening portion 85 may be displaced when it is formed, as illustrated in FIG. 35A, because of misalignment of a mask for forming resist pattern 86. There is another problem that diameter of opening portion 85 varies in size.

If etching is performed in such a situation, a recess 87 is generated.

Resist pattern 86 is then removed, and the surface of insulating film 82 is planarized by CMP. As a result, recess 87 remains at the surface of insulating film 82 even after planarizing process.

Therefore, a surface of a semiconductor device cannot be completely planarized by the method disclosed in the above-mentioned U.S. Pat. No. 4,954,459 either. Accordingly, the difference in level cannot be reduced by any of the conventional methods, making it difficult to minituarize semiconductor device having a structure of multi-layered interconnections.

Even if the difference in level at the convex pattern spreading horizontally on a large scale could be reduced by a conventional CMP method, the required polishing amount is greater. As a result, thickness of the film becomes uneven after it is polished, leading to a drop in yield. The method gives rise to another problem of a decrease in productivity because it requires a long time for polishing.

SUMMARY OF THE INVENTION

An object of the present invention is to provide a method for completely eliminating a difference in level at a convex pattern spreading horizontally on a large scale.

Another object of the present invention is to provide a method for producing a semiconductor device having an insulating film with a uniform thickness after being polished.

Still another object of the present invention is to provide an improved method allowing reduction in time for polishing and improvement in productivity.

A further object of the present invention is to provide an improved method which increases margin of mask alignment.

A further object of the present invention is to provide a semiconductor device having a multi-layered interconnection structure obtained in accordance with the above-mentioned method.

A semiconductor device according to a first aspect of the present invention relates to a semiconductor device having a planarized surface. The semiconductor device is provided with a semiconductor substrate. A portion having a high density of elements of an interconnection layer and spreading horizontally, and a portion having a low density of elements of the interconnection layer are provided on the semiconductor substrate. An interlayer insulating film is provided on the semiconductor substrate to cover both the high density interconnection portion and the low density interconnection portion. The shape of the high density portion is substantially that of a quadrangle having relatively short and long sides when viewed from above, with the short sides being 1 mm or longer. Variation in height as determined from a surface of the semiconductor substrate to a surface of the interlayer insulating film are limited to be within ±0.3 μm.

In a method of manufacturing a semiconductor device having a planarized surface according to a second aspect of the present invention, a semiconductor substrate is prepared on which a convex pattern portion including planarized portion spreading horizontally and outer periphery portion surrounding the planarized portion, and a concave portion are formed. An insulating film is formed on the semiconductor substrate so as to cover the convex portion and to fill in the concave portion. A portion of the insulating film located on the planarized portion of the convex pattern is selectively etched so as to leave a frame-shaped insulating film having a width of 1–500 μm at least on the outer periphery portion of the convex pattern. The insulating film left on the semiconductor substrate is etched by chemical/mechanical polishing method, thereby planarizing the surface of the semiconductor substrate.

A semiconductor device according to a first aspect of the present invention has a planarized surface because variation in height from a surface of a semiconductor substrate to a surface of an insulating film is made within ±0.3 μm.

In a method of manufacturing a semiconductor device according to a second aspect of the present invention, a convex portion spreading horizontally is transformed into a frame-shaped insulating film having a width of 1–500 μm, and then the insulating film is polished by CMP, thereby completely removing the horizontally spreading convex portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described below with reference to the drawings.

First Embodiment

Figure 1:
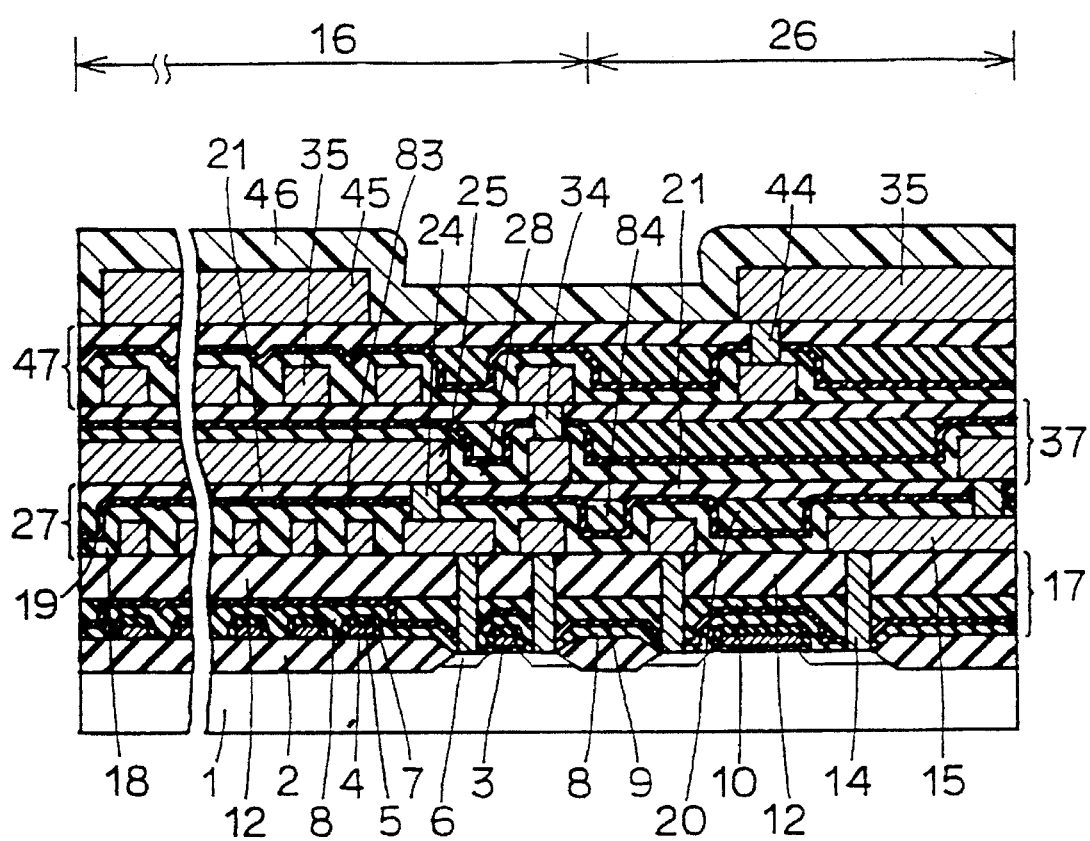
FIG. 1 is a cross sectional view of a semiconductor device according to a first embodiment of the present invention.
Figure 22:
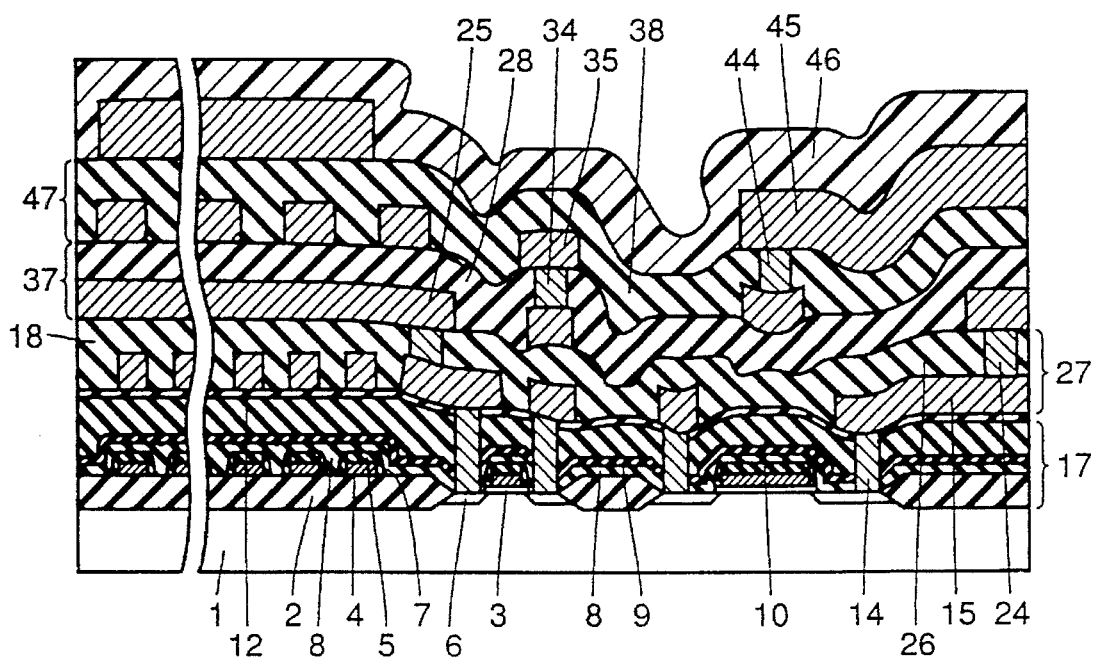
FIG. 22 is a cross sectional view of a conventional semiconductor device.
Figure 23:
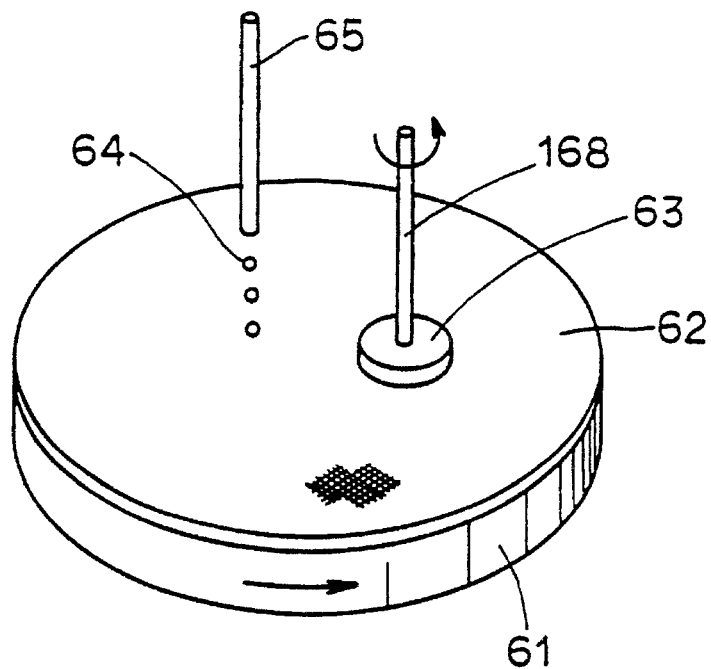
FIG. 23 shows a concept of chemical/mechanical polishing method.
Figure 24:
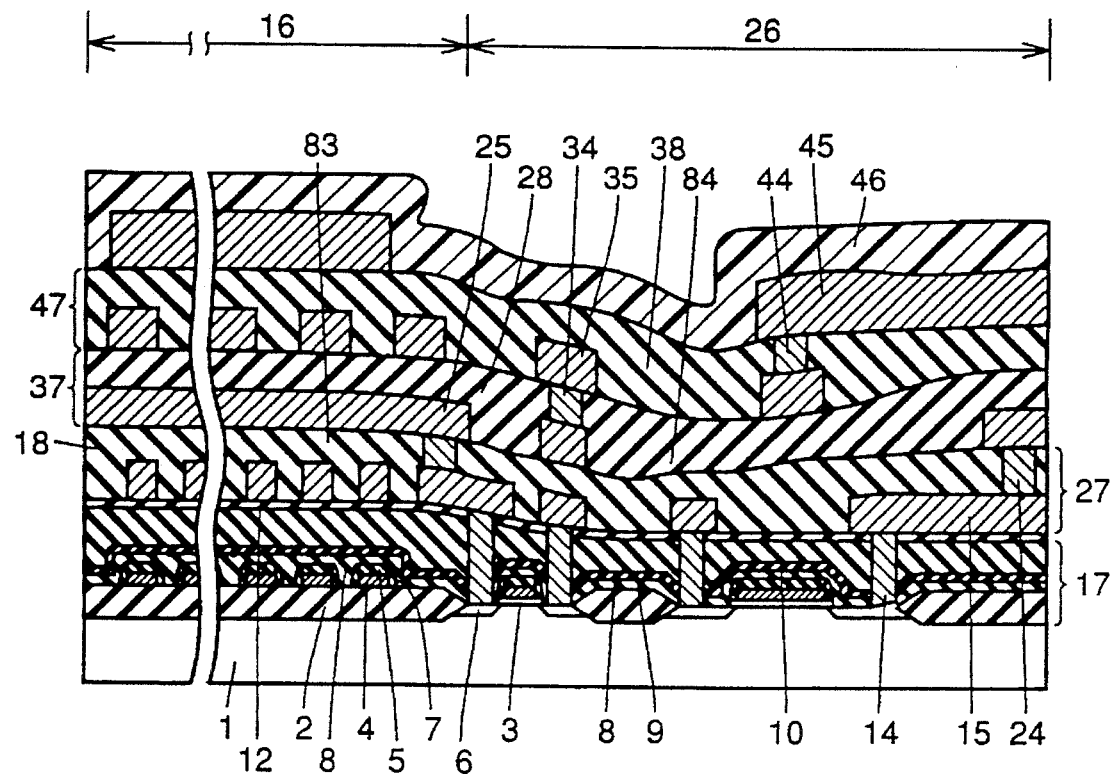
FIG. 24 is a cross sectional view of a conventional semiconductor device having an interlayer insulating film planarized by chemical/mechanical polishing method.
Figure 25:
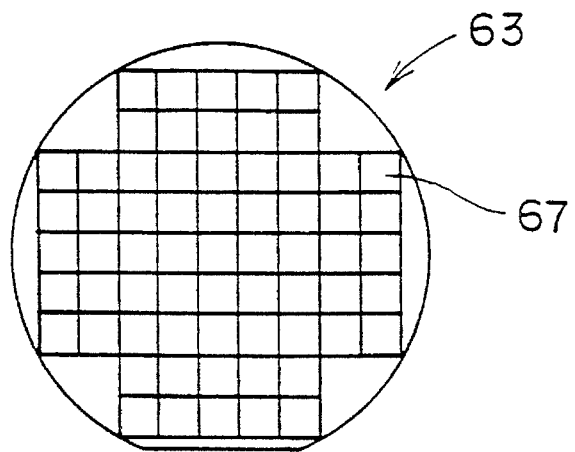
FIG. 25 is a plan view of a silicon wafer.
Figure 26:
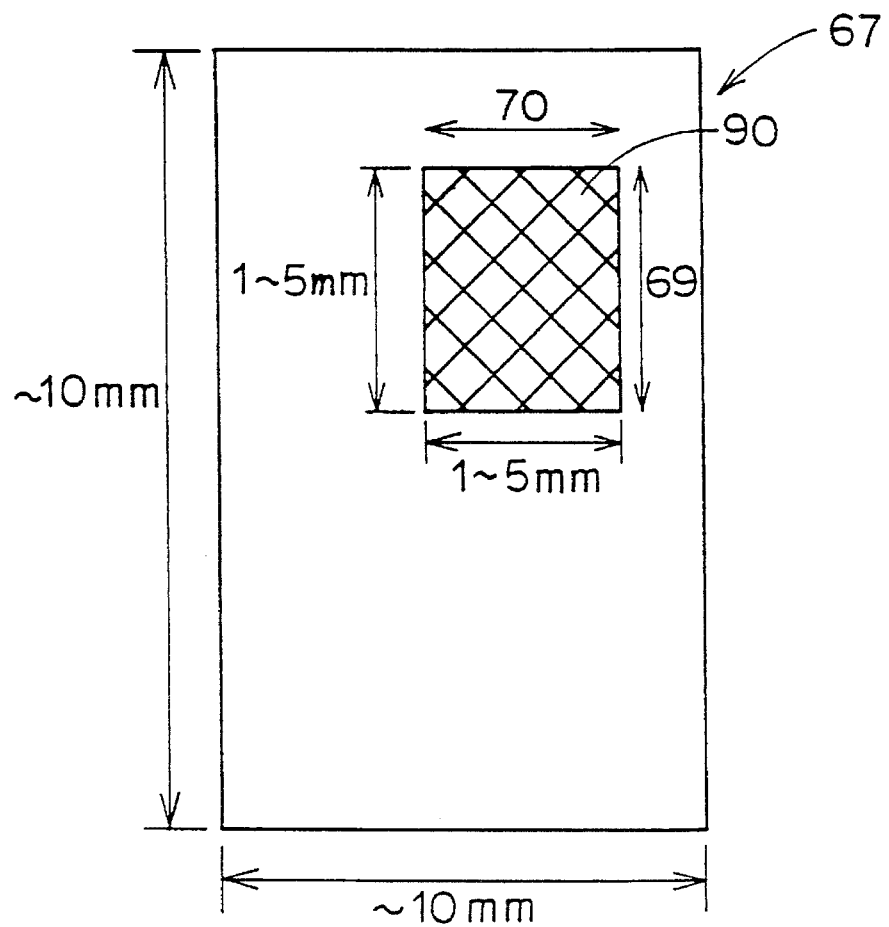
FIG. 26 is an enlarged view of a chip formed at the surface of the silicon wafer.
Figure 27A:
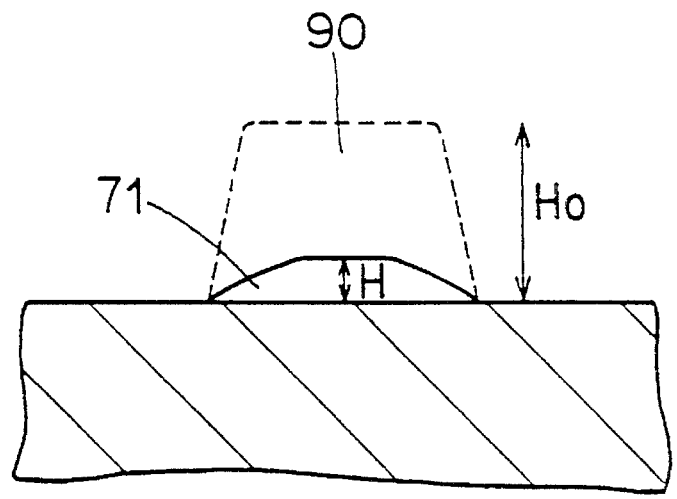
FIG. 27A is an illustration showing a relative difference in level ($H/H_0$), a ratio between a height of an initial convex portion and a height of a polished convex portion.
Figure 27B:
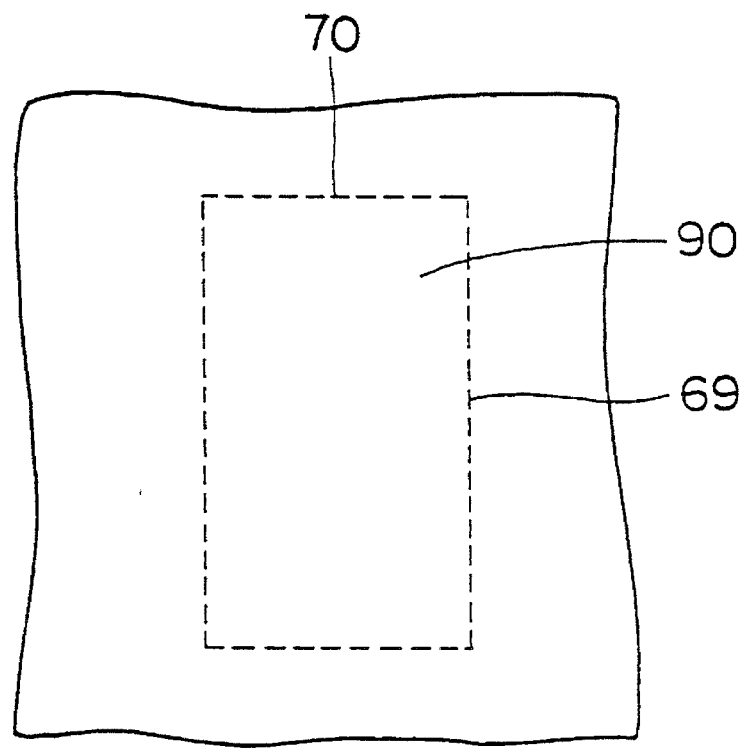
FIG. 27B is a plan view of FIG. 27A.
Figure 28:
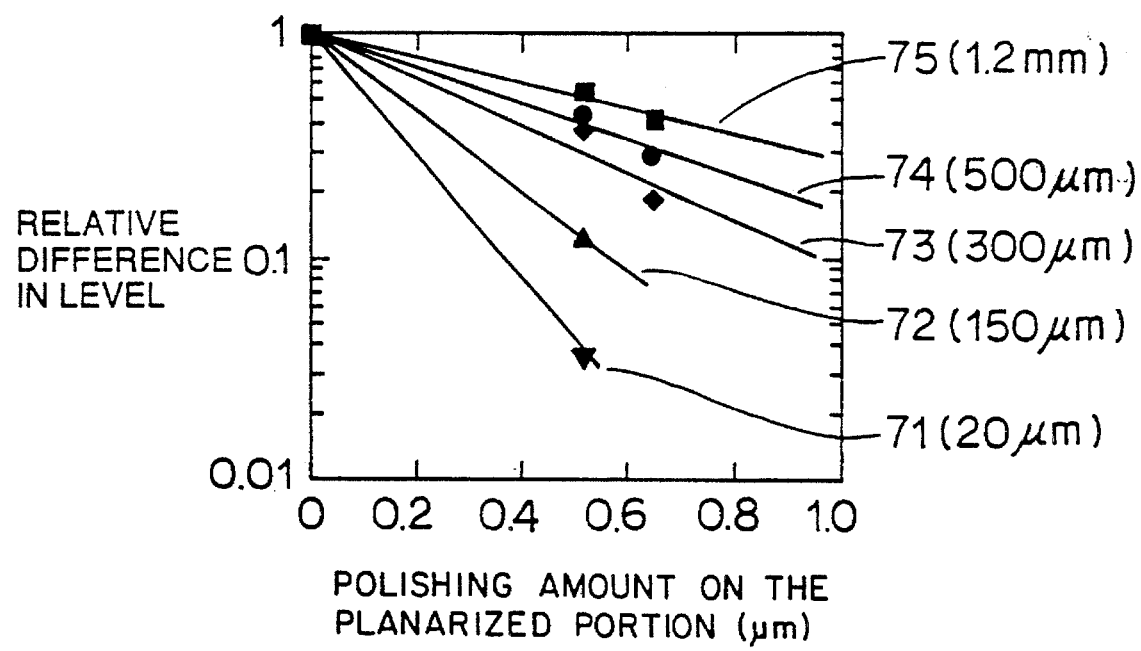
FIG. 28 shows a relation between a relative difference in level and polishing amount on a planarized portion.
Figure 29A:
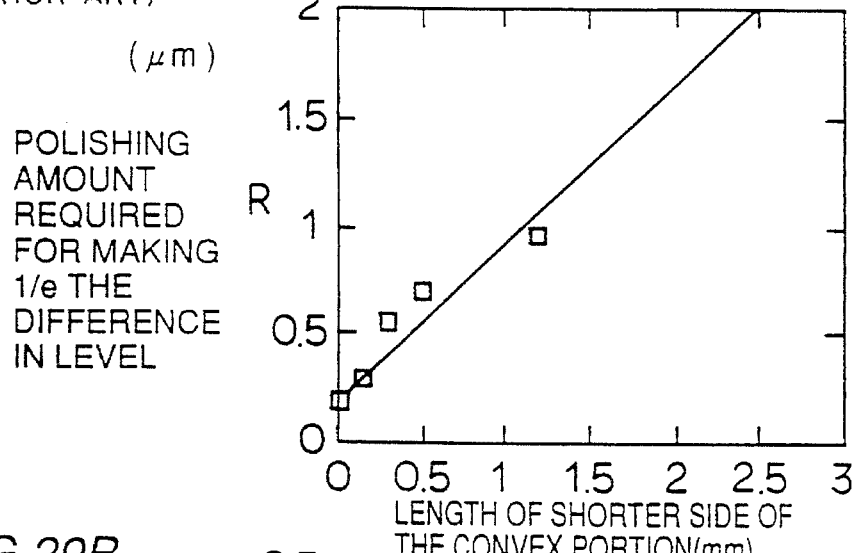
FIG. 29A is a graph showing a relation between a length of a shorter side of a convex portion and required polishing amount R for making a relative difference in level 1/e.
Figure 29B:
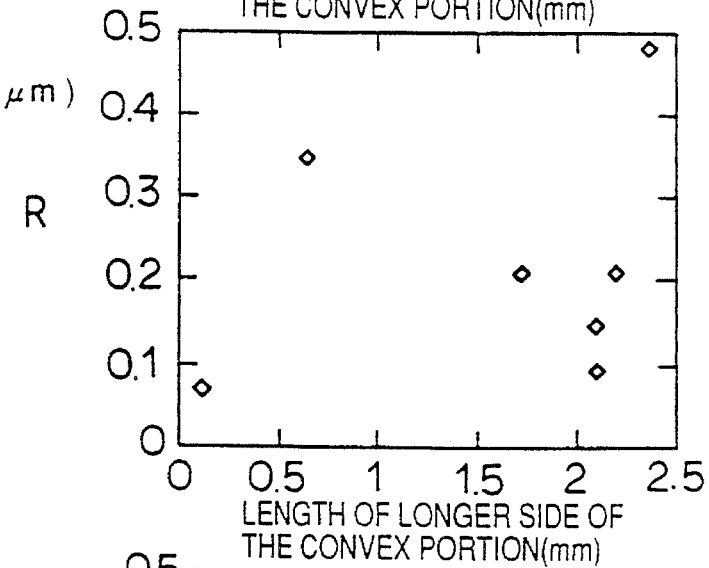
FIG. 29B is a graph showing a relation between a length of a longer side of a convex portion and required polishing amount R for making a relative difference in level 1/e.
Figure 29C:
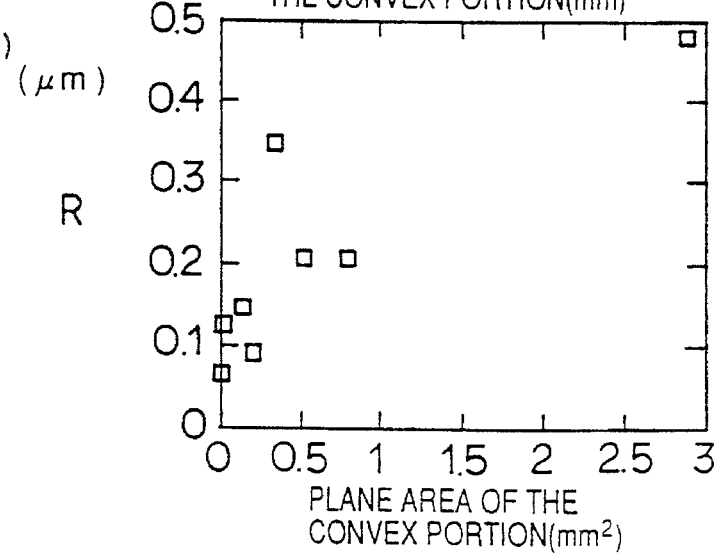
FIG. 29C is a graph showing a relation between a plane area of a convex portion and required polishing amount R for making a relative difference in level 1/e.
Figure 30:
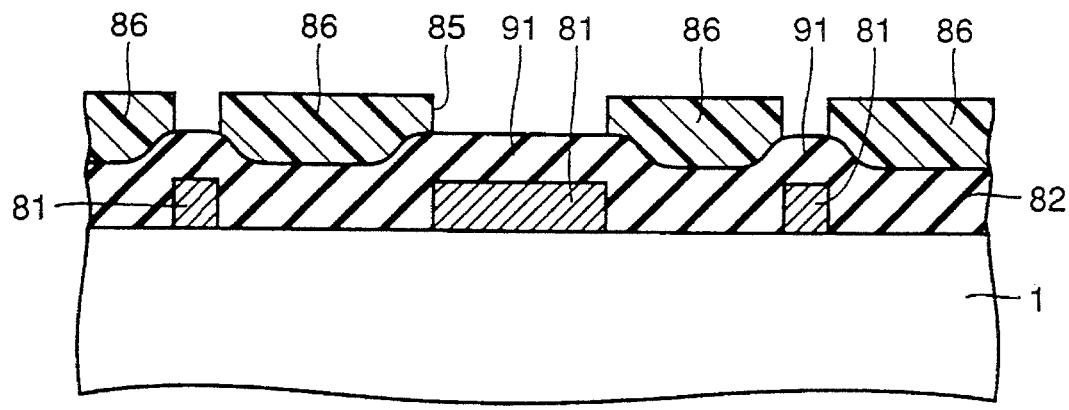
FIGS. 30 to 33 are cross sectional views of a semiconductor device showing first through fourth steps respectively in a conventional CMP method.
Figure 31:
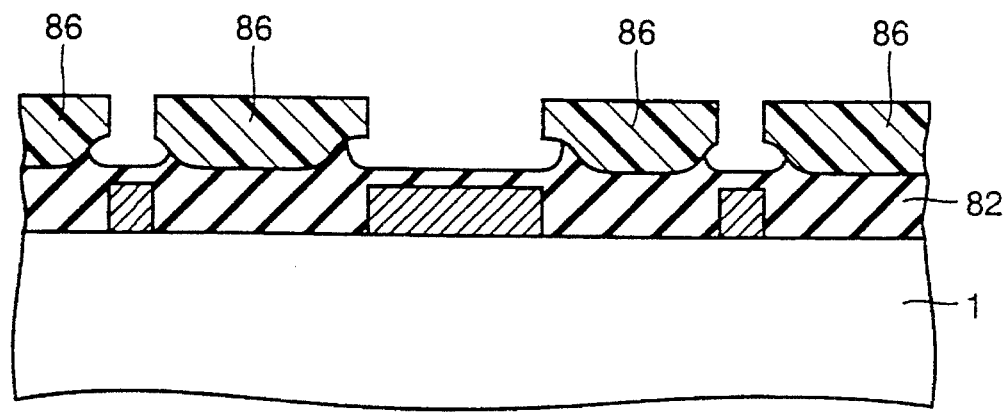
Figure 32:
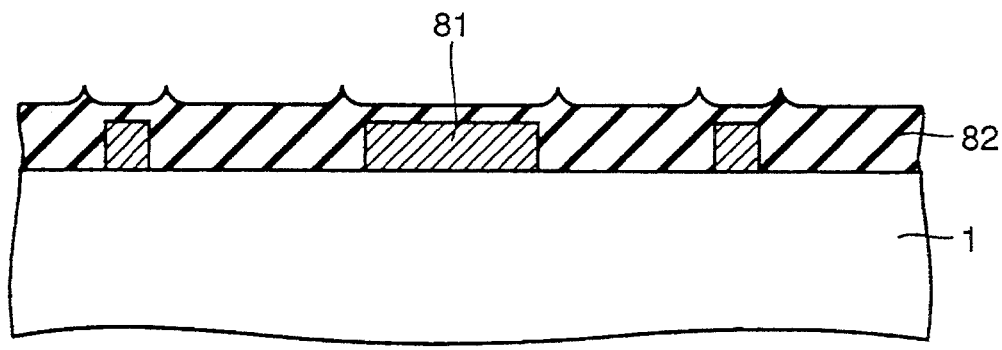
Figure 33:
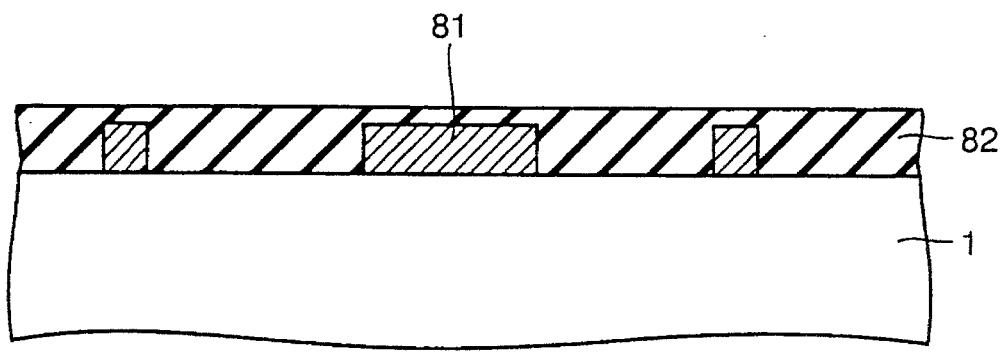
Figure 34A:
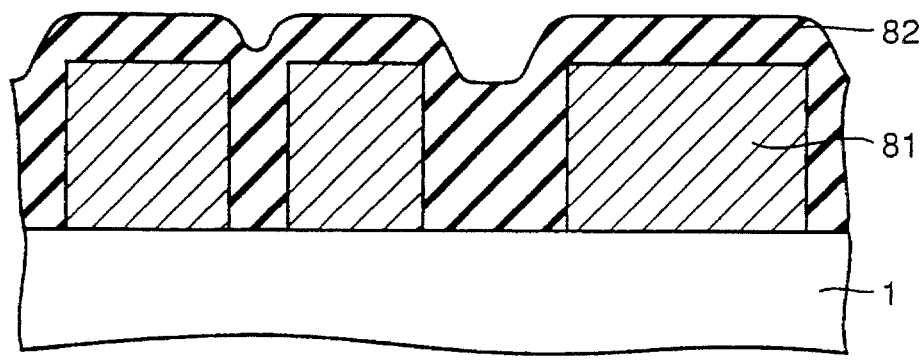
FIGS. 34A and 34B show a first problem of a conventional CMP method.
Figure 34B:
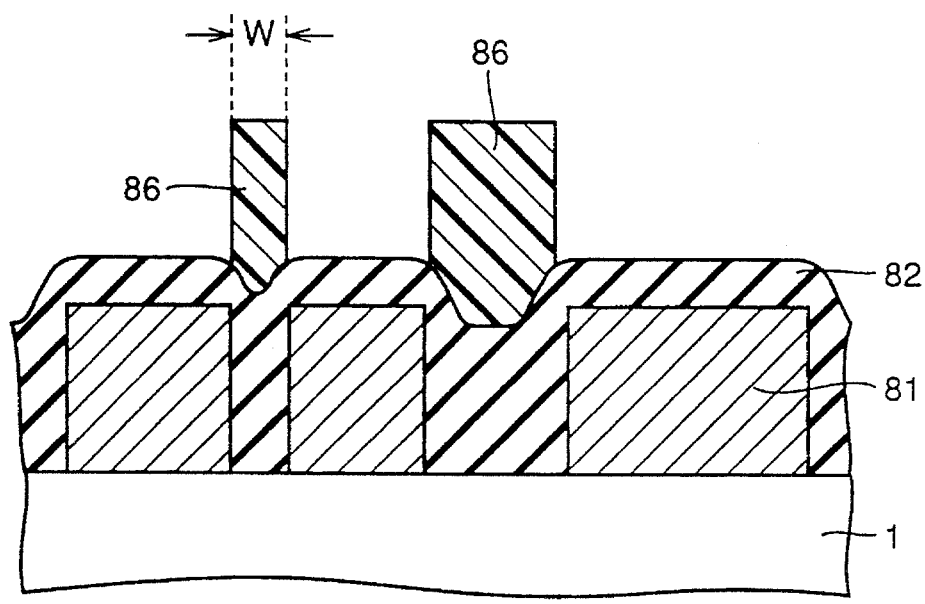
Figure 35A:
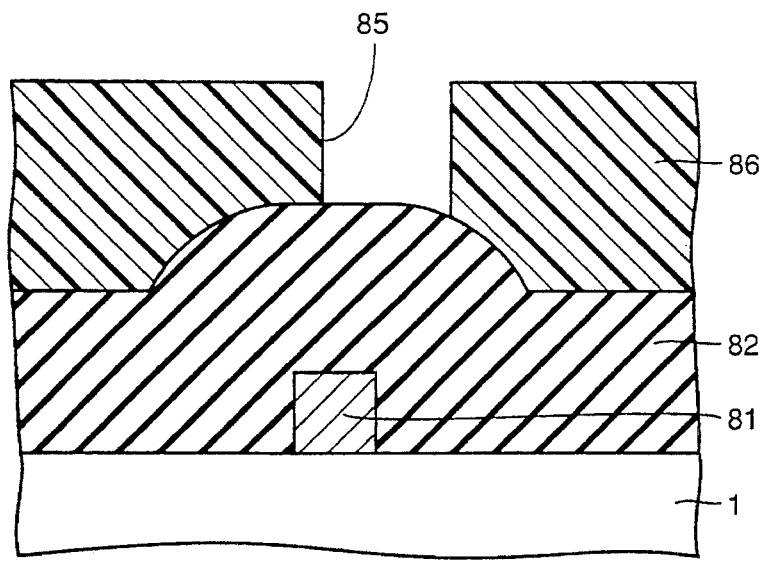
FIGS. 35A, 35B and 35C show a second problem of a conventional CMP method.
Figure 35B:
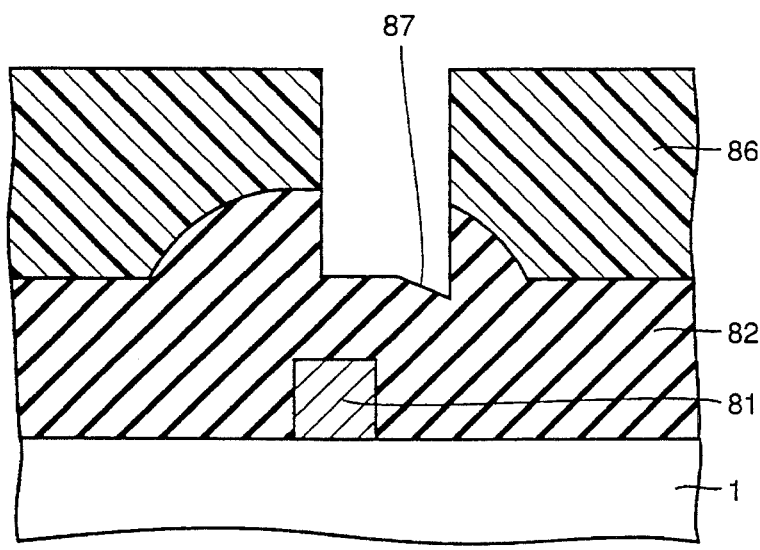
Figure 35C:
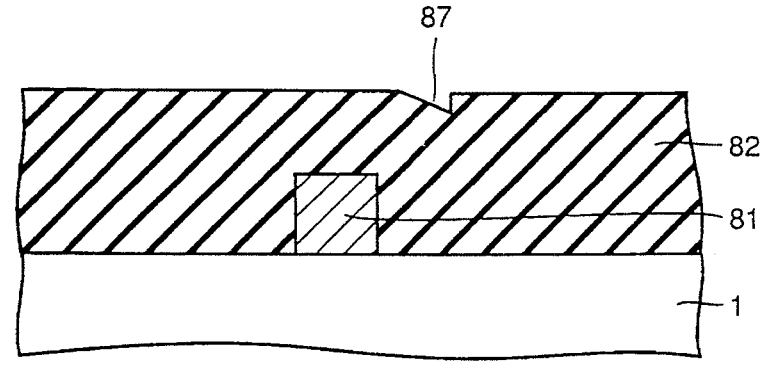

FIG. 1 is a cross sectional view of a semiconductor device having a planarized surface in accordance with one embodiment of the present invention. Since the embodiment shown in FIG. 1 is the same as a conventional semiconductor device shown in FIG. 22 except for the following point, like elements are denoted by like reference numerals and will not be described again. The embodiment shown in FIG. 1 differs from a conventional example shown in FIG. 22 in that a variation in height from a surface of a silicon substrate 1 to a surface of first through fourth interlayer insulating films 17, 27, 37 and 47, respectively is made within ±0.3 µm. Of the second interlayer insulting film 27, a region 16 having a high density of interconnections is formed of a silicon oxide film 18, a silicon nitride film 19 and a silicon oxide film 21, stacked in this order from the bottom, while a region 26 having a low density of interconnections is formed of a silicon oxide film 18, a silicon nitride film 19, a PSG (Phospho-Silicate Glass) film 20, and a silicon oxide film 21 stacked in this order from the bottom. Third and fourth interlayer insulating films 37 and 47 respectively have a similar structure.

Of first interlayer insulating film 17, a region where a gate 4 overlies an insulating oxide film 2 is constituted by silicon oxide films 5, 8 and 12 and a silicon nitride film 9, while the rest of the film is constituted by silicon oxide films 8 and 12, a BPSG film 10, and a silicon nitride film 9.

First through fourth interlayer insulating films 17, 27, 37, and 47 respectively are formed in accordance with a method of the present invention. In the present embodiment, a difference between the level of a convex pattern 83 spreading horizontally on a large scale and the level of a concave portion 84 is completely reduced, thereby planarizing the surface of the semiconductor device.

A method according to the present invention will now be described below, taking a method for forming a second interlayer insulating film 27 as an example.

Figure 2:
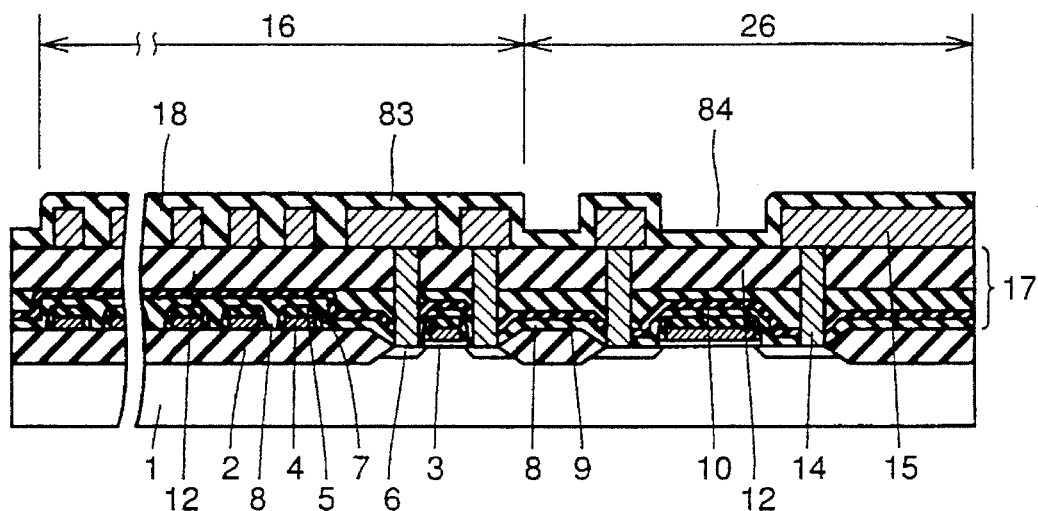
FIGS. 2 and 3 are cross sectional views of a semiconductor device showing first and second steps respectively in a method of manufacturing a semiconductor device according to a first embodiment.

Referring to FIG. 2, silicon oxide film 18 having a thickness of approximately 0.3 µm is formed on first interlayer insulating film 17 by plasma CVD or SOG method to cover a first interconnection layer 15. At this time, silicon oxide film 18 fills in gaps between adjacent elements of interconnection layer 15 in what may be conveniently referred to as a high interconnection density region 16, thereby forming convex pattern 83 spreading horizontally on a large scale, while a concave portion 84 is formed in the so-called low interconnection density region 26 which is a region containing fewer elements of the first interconnection layer 15.

Figure 3:
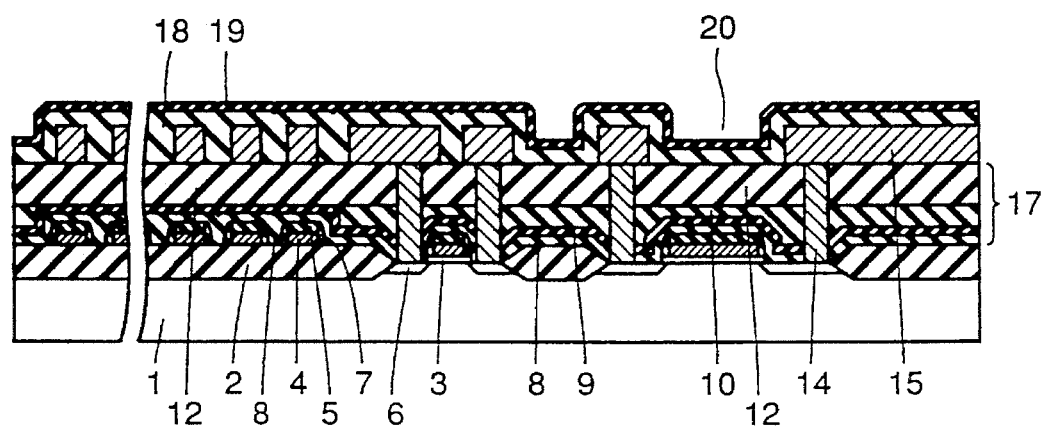

Referring to FIG. 3, silicon nitride film 19 having a thickness of approximately 0.02 µm is formed on silicon oxide film 18 by plasma CVD.

Figure 4A:
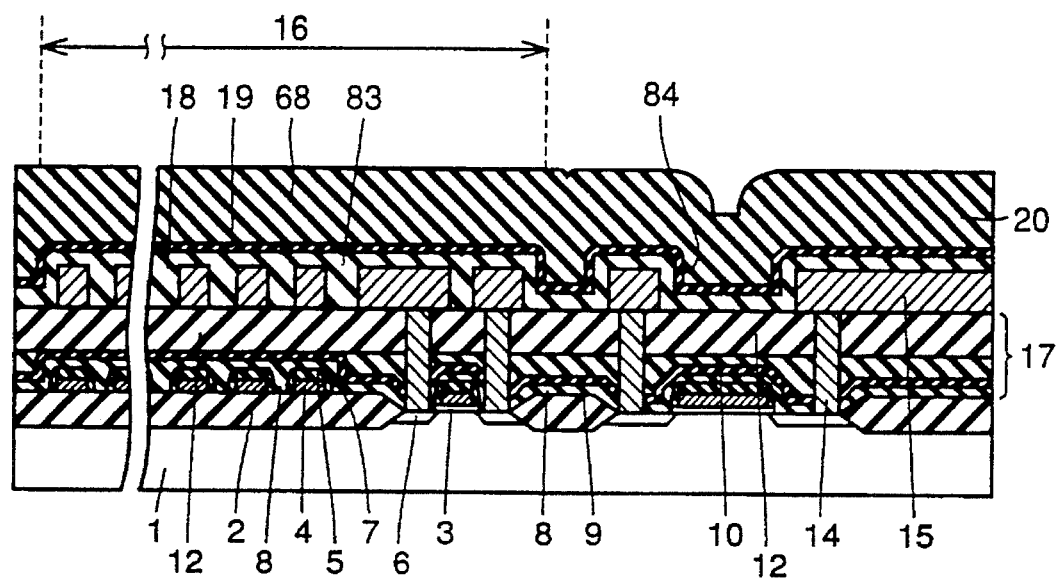
FIG. 4A is a partial cross sectional view of a semiconductor device showing a third step in a method of manufacturing a semiconductor device according to a first embodiment.

Referring to FIG. 4A, PSG film 20 having a phosphorus concentration of approximately 7 wt % is formed on silicon nitride film 19 by plasma CVD. The thickness of PSG film 20 is set to be greater than that of first interconnection layer 15 by approximately 0.2–0.5 µm.

Figure 4B:
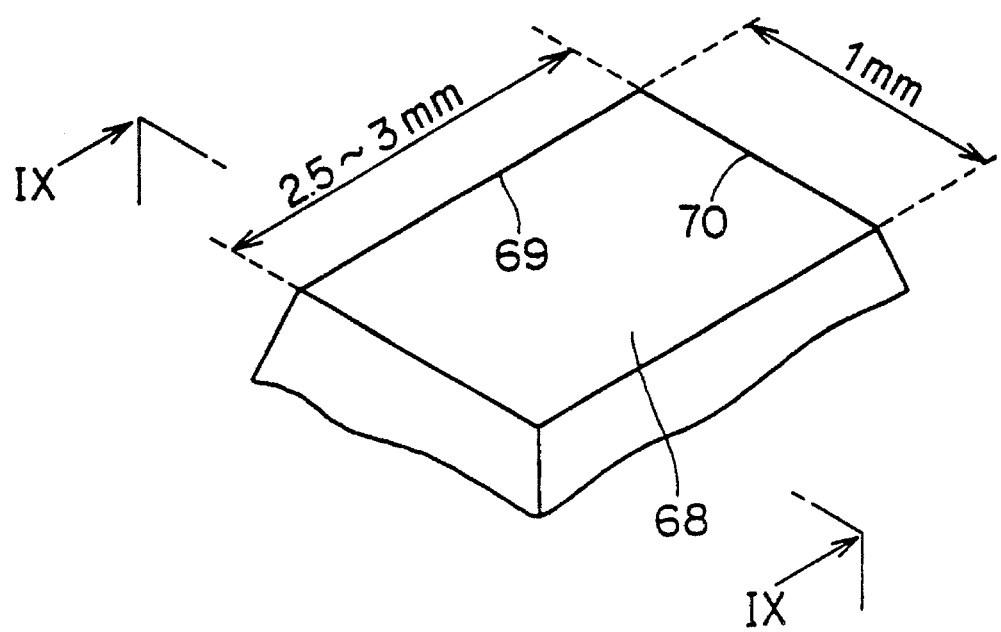
FIG. 4B is a perspective view of a convex portion, spreading horizontally on a large scale, of the semiconductor device shown in FIG. 4A.

At this time, in high interconnection density region 16, PSG film 20 is formed on convex pattern 83, thereby forming a convex portion 68 spreading horizontally on a large scale, and concave portion 84 is filled with PSG film 20. FIG. 4B is a perspective view of convex portion 68, spreading horizontally on a large scale, of the semiconductor device shown in FIG. 4A. Convex portion 68 has a rectangular plane with a shorter side 70 of 1 mm and a longer side 69 of 2.5–3 mm as illustrated in FIG. 4B.

Figure 5:
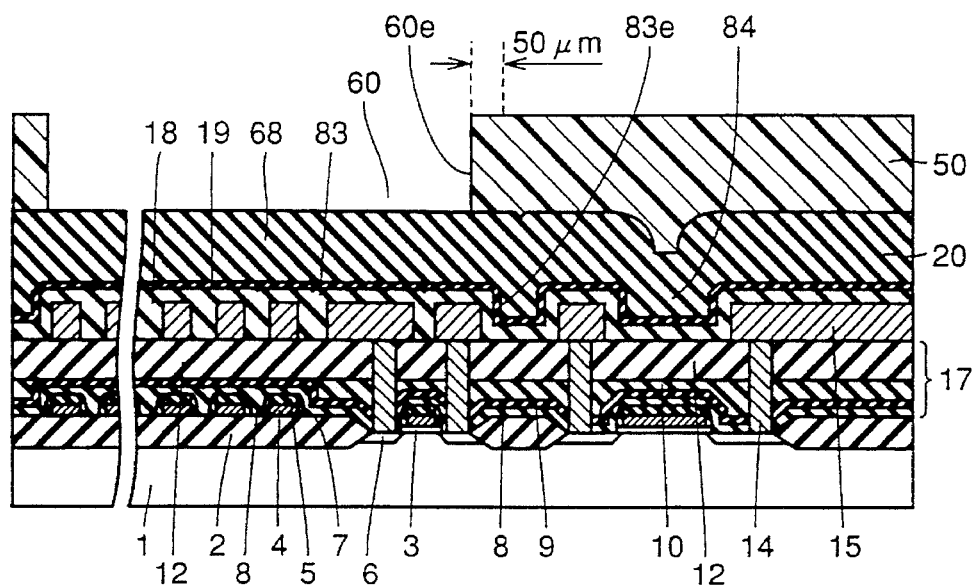
FIG. 5 is a cross sectional view, taken along the line A—A in FIG. 6, of a semiconductor device showing a fourth step in a method of manufacturing a semiconductor device according to a first embodiment.
Figure 6:
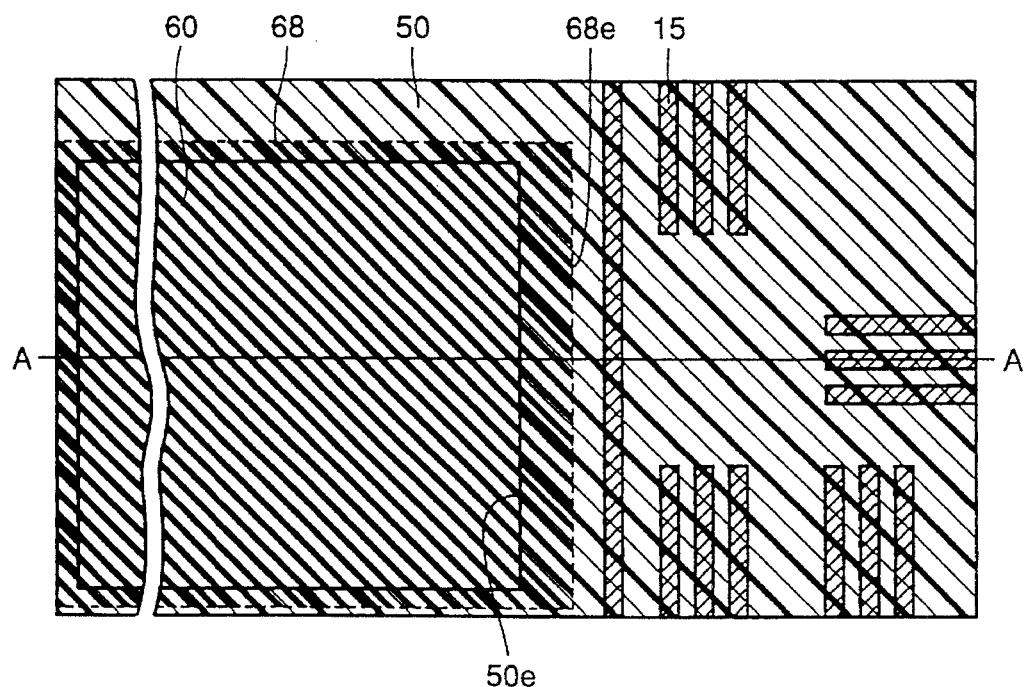
FIG. 6 is a plan view of the semiconductor device illustrated in FIG. 5.

Referring to FIGS. 5 and 6 (a plan view of FIG. 5), a region excluding convex portion 68 spreading horizontally on a large scale is covered with a photoresist 50. Photoresist 50 is then patterned so that an end portion 60e of its opening 60 is located approximately 50 µm inside an end portion 83e of convex pattern 83. If convex portion 68 has a shorter side of 100 µm or less, it is not necessary to form a resist pattern having such an opening as described. This is because a difference in level can be reduced to less than half with a polishing amount of 0.2–0.4 µm during etching by CMP if a shorter side of the convex portion is 100 µm or less.

Figure 7:
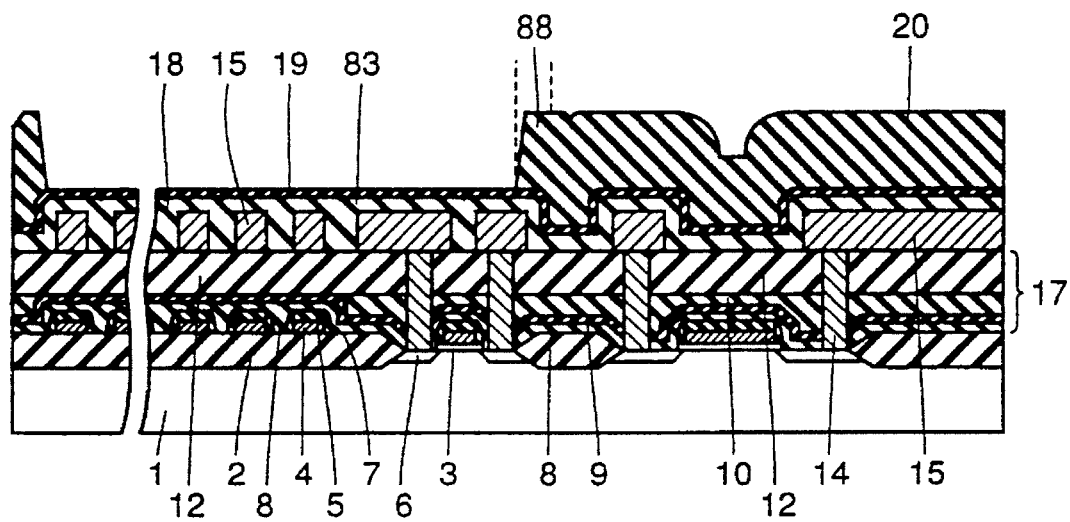
FIG. 7 is a cross sectional view of a semiconductor device showing a fifth step in a method of manufacturing a semiconductor device according to a first embodiment.
Figure 8:
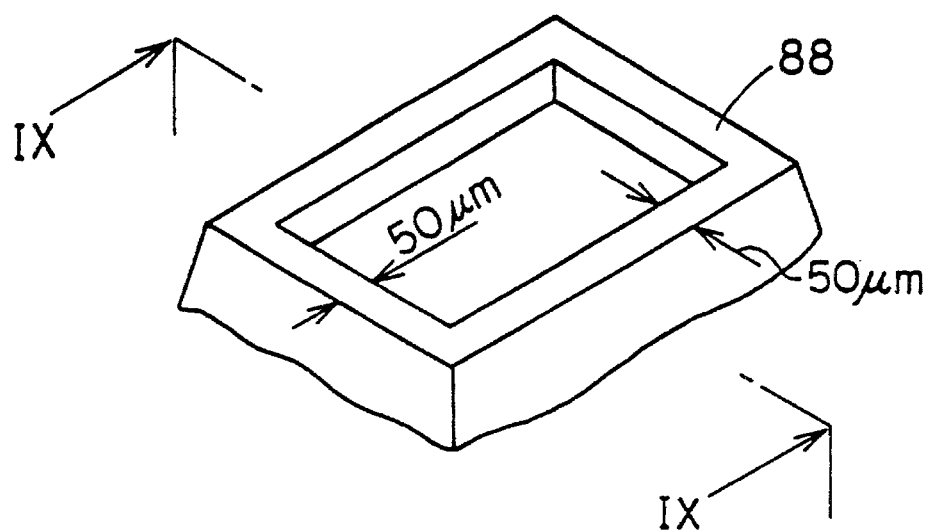
FIG. 8 is a perspective view of a frame-shaped PSG film obtained from a convex portion spreading horizontally on a large scale.
Figure 9A:
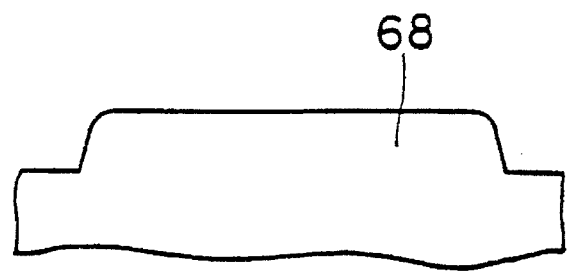
FIG. 9A is a cross sectional view taken along the line IX—IX in FIG. 4B.
Figure 9B:
FIG. 9B is a cross sectional view taken along the line IX—IX in FIG. 8.

Referring to FIGS. 5 and 7, PSG film 20 is etched with aqueous solution of hydrofluoric acid using photoresist 50 as a mask, and then photoresist 50 is removed. FIG. 8 shows a frame-shaped portion of PSG film 88 in FIG. 7 formed on the outer periphery of convex pattern 83 and having a width of approximately 50 µm. FIG. 9A is a cross sectional view taken along the line IX—IX in FIG. 4B. FIG. 9B is a cross sectional view taken along the line IX—IX in FIG. 8. Referring to these figures, convex portion 68 spreading horizontally on a large scale is transformed by the above-mentioned etching into frame-shaped convex portion 88 having a width of 50 µm. Referring to FIG. 8, frame-shaped PSG film 88 can be regarded as four rectangles joined together, each having a shorter side of 50 µm. That is, in accordance with this method, a convex portion having a shorter side of 100 µm or more and spreading horizontally on a large scale is transformed into a convex portion having a shorter side of 50 µm.

Referring to FIG. 7, the amount of etching PSG film 20 need only be more than the thickness of first interconnection layer 15. Since silicon nitride film 19 acts as an etching stopper, neither silicon oxide film 18 nor first interconnection layer 15 is etched even if etching time or etching rate varies.

Figure 10:
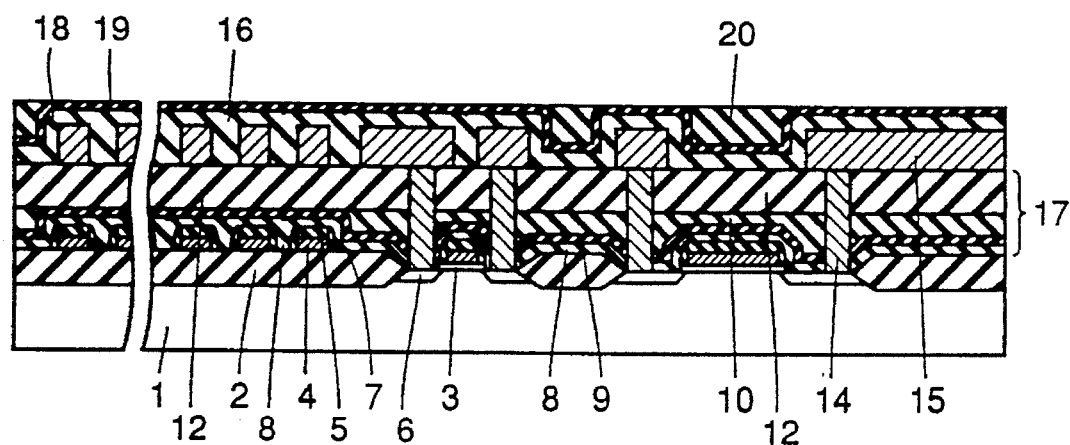
FIG. 10 is a cross sectional view of a semiconductor device showing a sixth step in a method of manufacturing a semiconductor device according to a first embodiment.

Referring to FIGS. 7 and 10, convex portion 88 can be completely removed by CMP with as little polishing amount as around 0.2–0.5 µm on a planarized portion. Since silicon nitride film 19 is polished at one-tenth the rate of PSG film 20, neither silicon oxide film 18 nor first interconnection layer 15 is polished even if the polishing rate varies.

Figure 11A:
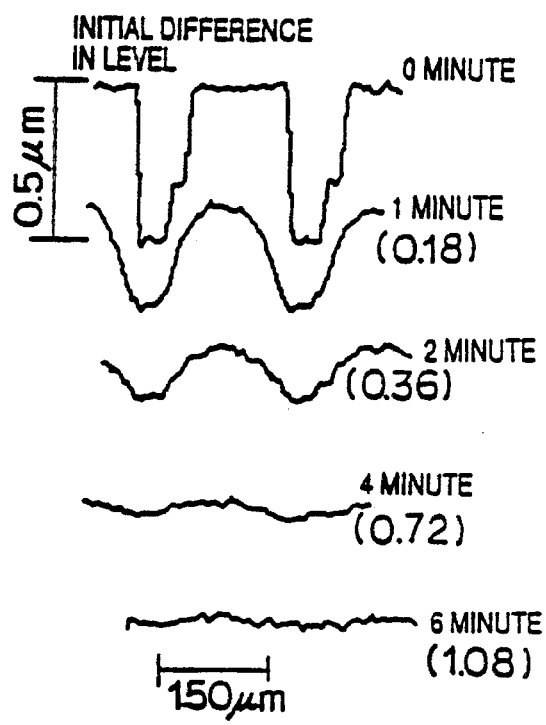
FIGS. 11A and 11B each show a relation between change in the shape of a convex portion and polishing time by CMP method when a shorter side of the convex portion is, respectively long (150 μm) or and short (30 μm).
Figure 11B:
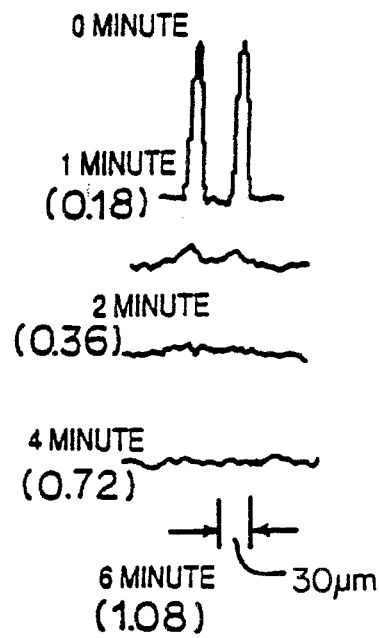

FIGS. 11A and 11B, respectively, shows how the convex portions having a shorter side of 150 µm (per FIG. 11A) and 30 µm (per FIG. 11B) change over time when they are etched by CMP. As one can see from FIG. 11A, it takes about six minutes to polish away the convex portion having a shorter side of 150 µm while only two to four minutes are needed if the convex portion has a shorter side of 30 µm as best seen in FIG. 11B. The numbers in the parentheses in FIGS. 11A and 11B represent the polishing amount (µm) in each case.

Figure 12:
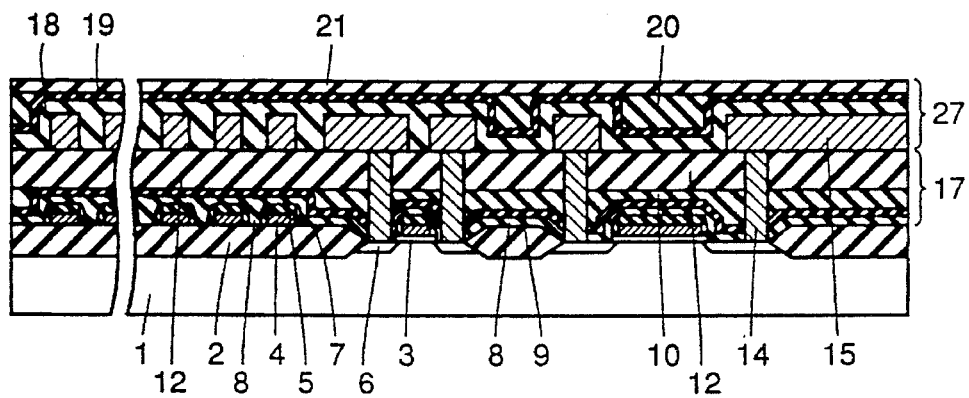
FIG. 12 is a cross sectional view of a semiconductor device showing a seventh step in a method of manufacturing a semiconductor device according to a first embodiment.

Referring to FIG. 12, silicon oxide film 21 is formed on the entire surface of silicon substrate 1 so as to prevent the second interconnection layer to be formed next from contacting PSG film 20. PSG film 20 reacts with moisture, causing generation of phosphoric acid at the surface thereof. Silicon oxide film 21 is provided to prevent direct contact of the second interconnection layer with PSG film 20 so that the phosphoric acid will not corrode the second interconnection layer to be formed next. This process completes second interlayer insulating film 27.

Further advantages of the present embodiment will be described below.

Referring to FIG. 5, end portion 60e of opening 60 of photoresist 50 is formed 50 µm inside end portion 83e of convex pattern 83 spreading horizontally on a large scale. Accordingly, there is a big margin for misalignment or variation in dimensions, thereby minimizing a drop in yield in this process. Furthermore, microlithography is not required for patterning or etching photoresist 50 because the dimensions of opening 60 depend on those of convex pattern 83. Therefore, relatively inexpensive projection aligner and etching means can be used.

In polishing by CMP, since a PSG film having a great etch rate in using aqueous solution of hydrofluoric acid is used as a layer to be polished, both polishing time and etching time can be reduced, thereby improving productivity.

In addition, a silicon nitride film is used as a stopper against etching with aqueous solution of hydrofluoric acid and against polishing by CMP, thereby increasing margin in the respective processes.

As inexpensive aqueous solution of hydrofluoric acid is used in the etching method of this embodiment, cost for the process can be reduced.

Second Embodiment

Although interlayer insulating films shown as an example in the above embodiment are formed of three layers including a silicon oxide film, a silicon nitride film, and a PSG film, the present invention is not limited thereto; an interlayer insulating film can be constituted only by a silicon oxide film or by two-layer structure of a PSG film and a silicon oxide film.

FIGS. 13–17 are partial cross sectional views of a semiconductor device showing in order respective steps in a manufacturing method in which an interlayer insulating film polished by CMP is formed only of a silicon oxide film.

In these figures, like or corresponding elements are denoted by like reference numerals as in FIG. 1, and description thereof will not be repeated.

Figure 13:
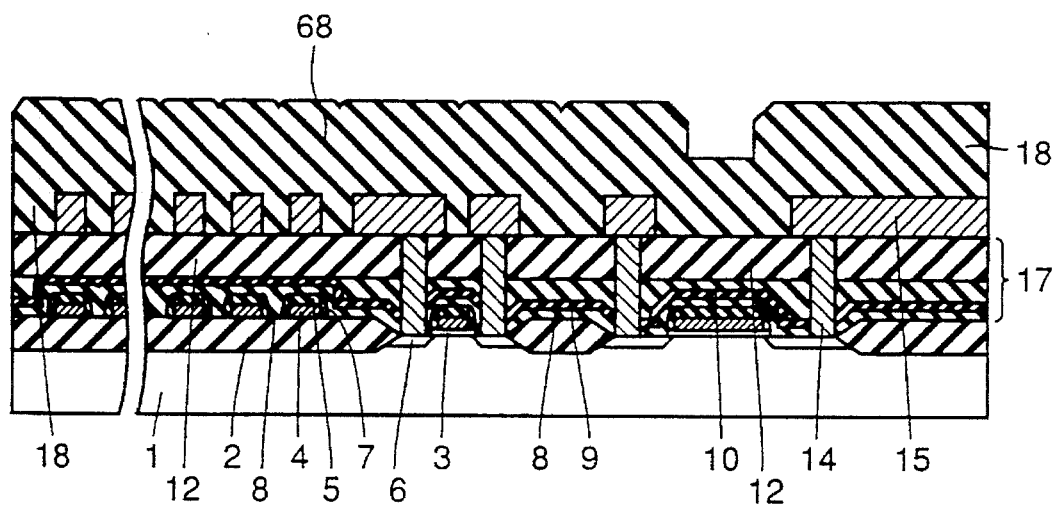
FIGS. 13 through 17 are cross sectional views of a semiconductor device showing first through fifth steps respectively in a manufacturing method according to a second embodiment of the present invention.

Referring to FIG. 13, a silicon oxide film 18 having a thickness of approximately 1.7 μm is formed to cover a first interconnection layer 15.

Figure 14:
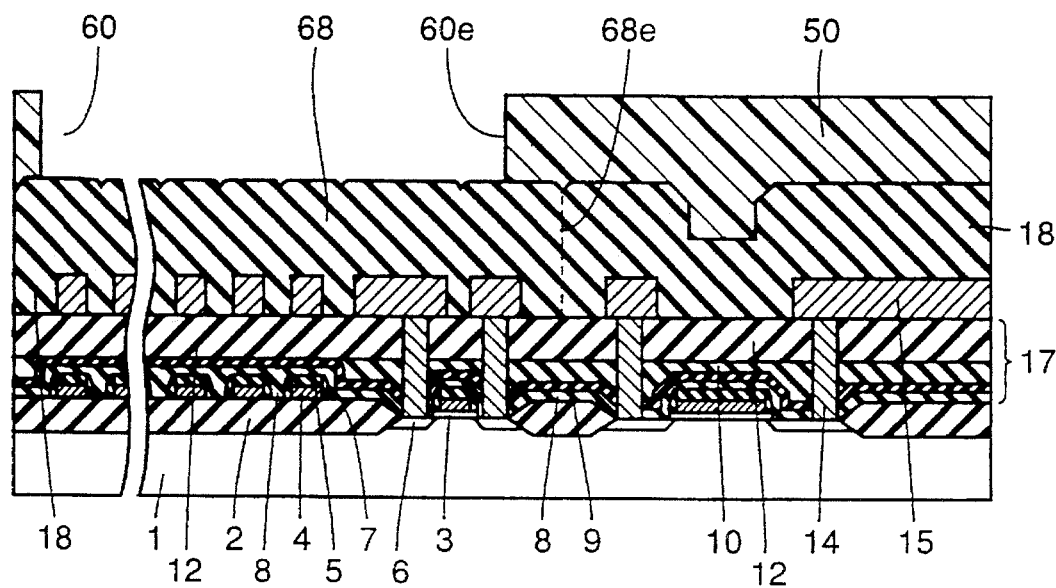
Figure 15:
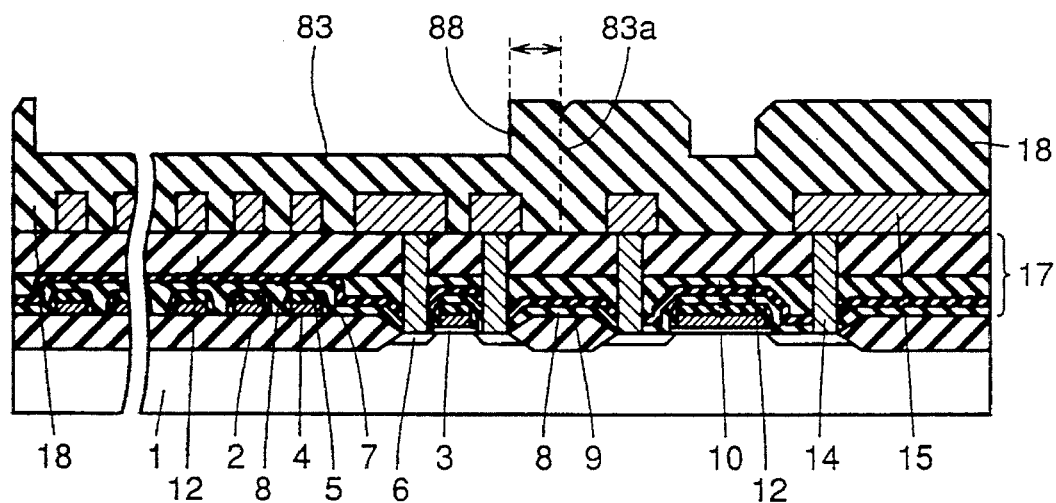

Referring to FIG. 14, a photoresist pattern 50 having an opening on a convex portion 68 spreading horizontally on a large scale is formed on silicon oxide film 18 as in the first embodiment. Silicon oxide film 18 is etched by 0.6 μm through RIE method using photoresist pattern 50 as a mask. The etching amount is made equal to the thickness of first interconnection layer 15. Photoresist pattern 50 is then removed. As in the first embodiment, an end portion 60e of an opening 60 of photoresist pattern 50 is positioned about 50 μm inside an end portion 68e of a convex portion 68. Referring to FIG. 15, silicon oxide film 18 is etched using photoresist pattern 50 as a mask, leaving, on an outer periphery portion 83a of convex pattern 83, a frame-shaped silicon oxide film 88 having a width of 100 μm or less.

Figure 16:
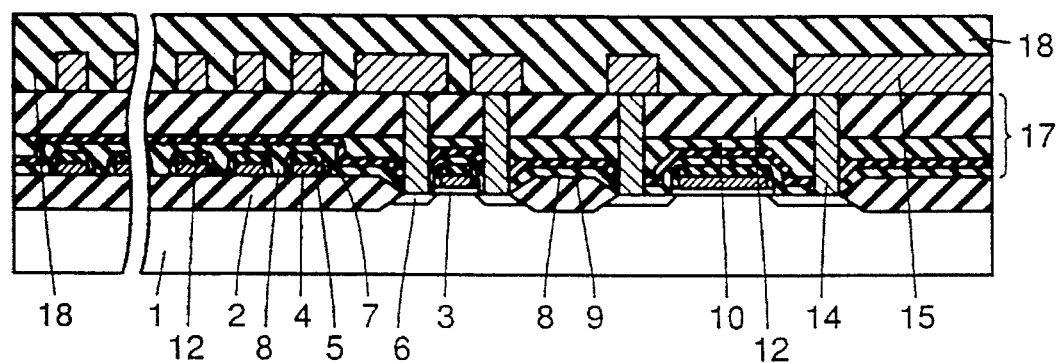

Referring to FIGS. 15 and 16, silicon oxide films 88 and 18 are polished through CMP method by about 0.2 μm at a planarized portion. As a result, frame-shaped silicon oxide film 88 is removed and a surface of silicon oxide film 18 is planarized as illustrated. The thickness of silicon oxide film 18 is approximately 0.9 μm from the surface of first interconnection layer 15.

A second interconnection layer can be formed directly on silicon oxide film 18 in the state shown in FIG. 16. In order to remove flaws left on silicon oxide film 18, the surface of silicon oxide film 18 can be etched by, for example, aqueous solution of hydrofluoric acid and then second interconnection layer can be formed thereon.

Figure 17:
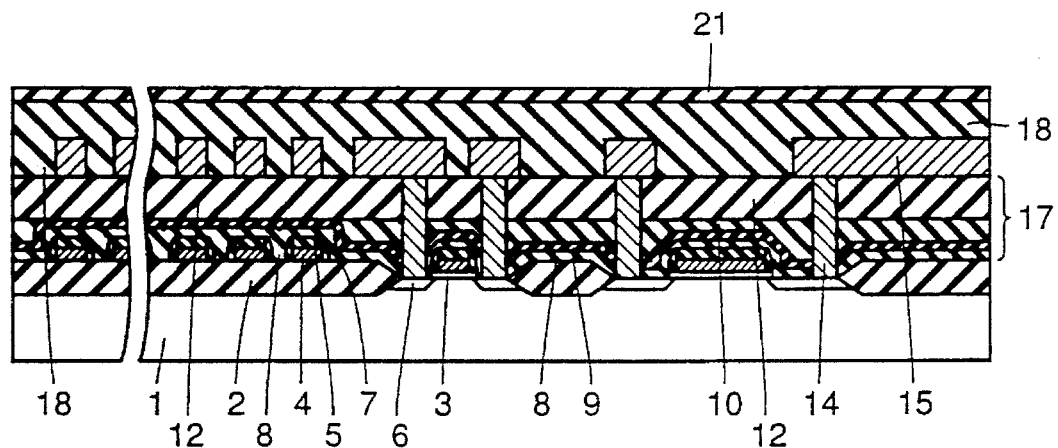

For the purpose of removing flaws left on silicon oxide film 18, a silicon oxide film 21 can be stacked on silicon oxide film 18 as shown in FIG. 17 after the etching by CMP.

In the present embodiment, although the thickness of first interconnection layer 15 and the amount of etching silicon oxide film 18 must be equal, other values are not limited to the above mentioned ones. Although RIE method is used as an exemplary etching method in the present embodiment, etching methods using aqueous solution of hydrofluoric acid or the like can be used.

The present embodiment has disadvantages that process margin against etching or polishing is less than the first embodiment and that time required for etching is longer because the present embodiment uses a silicon oxide film which does not include phosphorus and because the polishing rate is low. The second embodiment, however, has an advantage over the first one in that it has smaller number of steps.

Third Embodiment

In the present embodiment, a silicon oxide film and a PSG film are used as an interlayer insulating film etched by CMP method. FIGS. 18–21 are partial cross sectional views of a semiconductor device showing in order respective steps in a manufacturing method of the third embodiment.

A silicon oxide film 18 having a thickness of approximately 0.3 μm is formed on a silicon substrate 1 to cover a first interconnection layer 15. At this time, a convex pattern 83 spreading horizontally on large scale and a concave portion 84 are formed on silicon substrate 1. A PSG film 20 having a thickness of approximately 0.7 μm is formed on silicon substrate 1, covering convex pattern 83 which spreads horizontally on a large scale and filling in concave portion 84, thereby forming a convex portion 68 spreading horizontally on a large scale and a concave portion 89.

Figure 18:
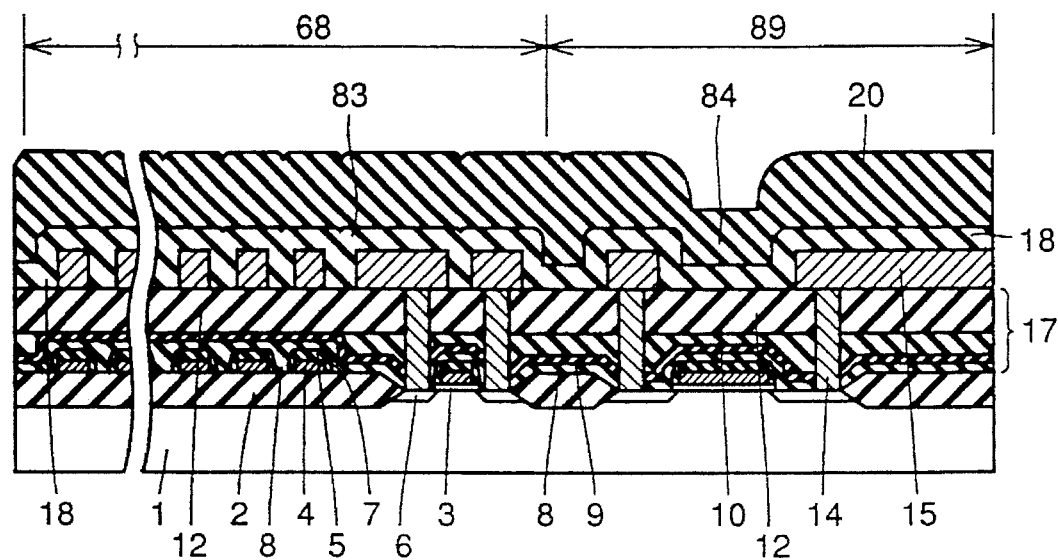
FIGS. 18 through 21 are cross sectional views of a semiconductor device showing first through fourth steps respectively in a manufacturing method according to a third embodiment of the present invention.
Figure 19:
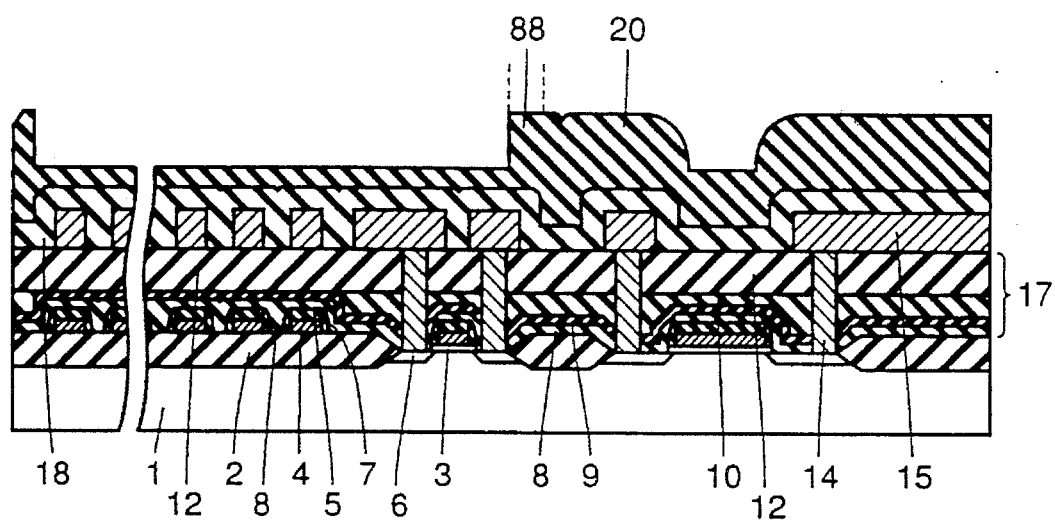

As in the first embodiment, a photoresist pattern (not shown) is formed on PSG film 20. By etching PSG film 20 using the photoresist pattern as a mask, a semiconductor device shown in FIG. 19 is obtained. Referring to FIGS. 18 and 19, convex portion 68 spreading horizontally on a large scale is transformed by this etching into a frame-shaped PSG film 88 having a width of 100 μm or less. The amount of etching PSG film 20 is set to be equal to the thickness of first interconnection layer 15.

Figure 20:
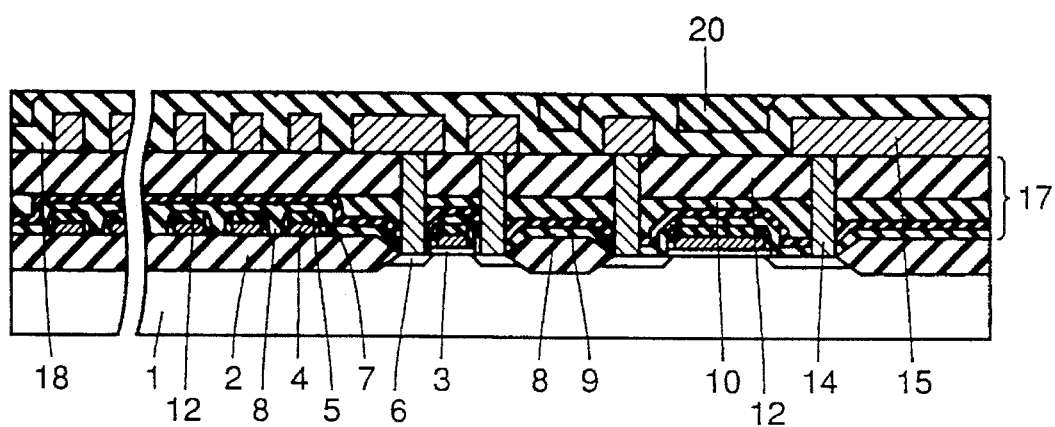

Referring to FIGS. 19 and 20, PSG film 20 is polished by CMP such that the polishing amount at a planarized portion is around 0.2–0.5 μm, thereby planarizing the surface of the semiconductor device as illustrated.

Figure 21:
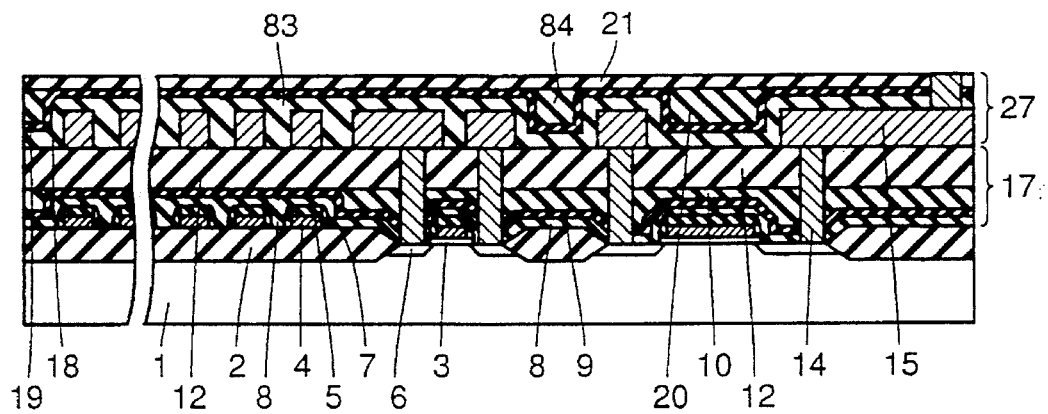

Referring to FIG. 21, a silicon oxide film 21 having a thickness of approximately 0.6 μm is formed on silicon substrate 1, thereby completing a second interlayer insulating film 27.

In the present embodiment, second interlayer insulating film 27 is formed of silicon oxide films 18 and 21 and PSG film 20. Although the present embodiment requires more steps than the second embodiment in which the second interlayer insulating film is constituted solely by a silicon oxide film, productivity is improved because a PSG film has greater etch rate and polishing rate.

A method of forming second interlayer insulating film 27 is explained in the three embodiments described above. The present invention, however, is not limited thereto, and can be applied to all interlayer insulating films 17, 27, 37 and 47 shown in FIG. 1.

Although a PSG film is used, as an example, as an interlayer insulating film etched by CMP, the present invention is not limited thereto, and BPSG film can also be used.

If complete planarization is not required in view of microlithography, the present invention can be applied only to some of the first to fourth interlayer insulating films.

Although a frame-shaped insulating film, which is formed on the outer periphery portion of a convex portion spreading horizontally on large scale, has a width of 100 μm or less in the above-described embodiments, the present invention is not limited thereto, and a similar effect can be obtained if the width is within the range of 1–500 μm.

Since the thickness of films mentioned in the above embodiments depends on a thickness of an interconnection layer and a final thickness of an interlayer insulating film, it is not limited to the above-mentioned values.

As described above, a semiconductor device in accordance with a first aspect of the present invention has a planarized surface because variation in height from a surface of a semiconductor substrate to a surface of an insulating film is made within ±0.3 μm.

In a method of manufacturing a semiconductor device in accordance with a second aspect of the present invention, a convex portion which spreads horizontally is transformed into a frame-shaped insulating film having a width of 1–500 μm. Since the insulating film is then etched by CMP, the horizontally spreading convex portion is completely removed. As a result, a semiconductor device having a planarized surface can be obtained. In accordance with the present invention, it is also possible to minimize a decrease in yield because margin for misalignment and variation in dimensions is increased. Furthermore, relatively inexpensive projection aligner and etching means can be used because patterning and etching of a resist do not require microlithography.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a planarized surface, comprising:

a semiconductor substrate;

an interconnection layer portion provided on a surface of said semiconductor substrate and having a plurality of elements of at least one interconnection layer spreading horizontally, comprising a high density portion having a relatively high number of interconnection elements and a low density portion comprising a relatively low number of said interconnection elements;

a first interlayer insulating film provided on said semiconductor substrate to cover both said high interconnection density portion and said low interconnection density portion and having an insulating film surface;

a second interlayer insulating film provided over said first interlayer insulating film; wherein at said high interconnection density portion, each of said first and second interlayer insulating films comprises a first silicon oxide film, a silicon nitride film and a second silicon oxide film, formed in this order relative to said substrate surface;

at said low interconnection density portion, said first interlayer insulating film includes said first silicon oxide film, said silicon nitride film, a PSG film and said second silicon oxide film, formed in this order relative to said substrate surface;

variations in height, as determined from said surface of said semiconductor substrate to said first insulating film surface extending over said high and said low interconnection density portions are limited to be within a range of ±0.3 μm.

* * * * *